United States Patent
Manning

(10) Patent No.: US 6,366,992 B2
(45) Date of Patent: Apr. 2, 2002

(54) METHOD AND SYSTEM FOR BYPASSING PIPELINES IN A PIPELINED MEMORY COMMAND GENERATOR

(75) Inventor: Troy A. Manning, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/748,954

(22) Filed: Dec. 26, 2000

Related U.S. Application Data

(63) Continuation of application No. 09/126,318, filed on Jul. 30, 1998, now Pat. No. 6,175,905.

(51) Int. Cl.[7] ............................................. G06F 12/00
(52) U.S. Cl. ....................................... 711/167; 711/138
(58) Field of Search ................................ 711/117, 138, 711/140, 167, 169

(56) References Cited

U.S. PATENT DOCUMENTS

| | | | |
|---|---|---|---|
| 4,312,068 A | 1/1982 | Goss et al. | 371/37 |
| 4,365,295 A | 12/1982 | Katzman et al. | 364/200 |
| 4,630,230 A | 12/1986 | Sundet | 364/900 |
| 4,695,952 A | 9/1987 | Howland | 364/200 |
| 4,768,190 A | 8/1988 | Giancarlo | 370/86 |

(List continued on next page.)

FOREIGN PATENT DOCUMENTS

| | | |
|---|---|---|
| EP | 0 468 480 A2 | 5/1992 |
| EP | 0 605 887 A2 | 7/1994 |
| GB | 2 128 383 A | 4/1984 |
| JP | 59116829 | 7/1984 |
| JP | 09161475 | 6/1997 |
| WO | WO 96/24935 | 8/1996 |

OTHER PUBLICATIONS

Descriptive literature entitled, "400MHz SLDRAM, 4M X 16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLink)," Microprocessor and Microcomputer Standards Subcommitee of the IEEE Computer Society, Copyright 1996 by the Institute of Electrical and Electronics Engineers, Inc., New York, NY, pp. 1–56.

Gillingham, P., "SLDRAM Architectural and Functional Overview," SLDRAM Consortium, Aug. 29, 1997, pp. 1–14.

"Increasing Data Read Rate from Memories," IBM Technical Disclosure Bulletin, vol. 30, No. 12, May 1988, pp. 339–341.

Prince, Betty, "High Performance Memories," John Wiley & Sons Ltd., West Sussex, England, 1996, pp. 143–146.

Primary Examiner—Matthew Kim
Assistant Examiner—Christian P. Chace
(74) Attorney, Agent, or Firm—Dorsey & Whitney LLP

(57) ABSTRACT

A method and system for bypassing command pipelines in a pipelined memory command generator is used whenever commands must be generated with a latency that is shorter than the latency at which commands can be generated using the command pipelines. The timing of commands issued by the command pipelines is a function of a digital word, and the digital word therefore indicates the latency of the command generator. When the digital word corresponds to a latency that is shorter than the latency at which the command pipeline can generate commands for read and write operations, a bypass circuit—rather than the command pipeline—generates the commands. The bypass circuit is capable of generating the commands with a latency that is shorter than the latency at which the command pipeline is capable of issuing the commands. In addition to issuing the commands, the bypass circuit generates an inhibit signal to prevent the command pipelines from generating duplicate commands.

13 Claims, 11 Drawing Sheets

U.S. PATENT DOCUMENTS

| | | | |
|---|---|---|---|
| 4,845,664 A | 7/1989 | Aichelmann, Jr. et al. | 364/900 |
| 4,849,702 A | 7/1989 | West et al. | 328/63 |
| 4,943,946 A | 7/1990 | Brent | 365/189.12 |
| 4,949,301 A | 8/1990 | Joshi et al. | 364/900 |
| 5,099,481 A | 3/1992 | Miller | 371/22.1 |
| 5,175,732 A | 12/1992 | Hendel et al. | 370/94.1 |
| 5,235,595 A | 8/1993 | O'Dowd | 370/392 |
| 5,297,029 A | 3/1994 | Nakai et al. | 365/238.5 |
| 5,321,700 A | 6/1994 | Brown et al. | 371/27 |
| 5,325,493 A | 6/1994 | Herrell et al. | 395/375 |
| 5,337,410 A | 8/1994 | Appel | 395/162 |
| 5,341,483 A | 8/1994 | Frank et al. | 395/400 |
| 5,355,345 A | 10/1994 | Dickinson et al. | 365/230.01 |
| 5,367,643 A | 11/1994 | Chang et al. | 395/325 |
| 5,390,224 A | 2/1995 | Komatsuda | 377/56 |
| 5,402,390 A | 3/1995 | Ho et al. | 365/225.7 |
| 5,454,093 A | 9/1995 | Abdulhafiz et al. | 711/133 |
| 5,471,430 A | 11/1995 | Sawada et al. | 365/222 |
| 5,553,010 A | 9/1996 | Tanihira et al. | 364/715.08 |
| 5,557,763 A | 9/1996 | Senter et al. | 712/23 |
| 5,566,325 A | 10/1996 | Bruce, II et al. | 395/494 |
| 5,581,512 A | 12/1996 | Kitamura | 365/233 |
| 5,600,605 A | 2/1997 | Schaefer | 365/233 |
| 5,615,355 A | 3/1997 | Wagner | 395/494 |
| 5,636,174 A | 6/1997 | Rao | 365/230.03 |
| 5,640,354 A | 6/1997 | Jang et al. | 365/201 |
| 5,652,733 A | 7/1997 | Chen et al. | 365/233 |
| 5,701,434 A | 12/1997 | Nakagawa | 711/157 |
| 5,713,005 A | 1/1998 | Proebsting | 395/496 |
| 5,732,041 A | 3/1998 | Joffe | 365/230.05 |
| 5,737,563 A | 4/1998 | Shigeeda | 395/405 |
| 5,742,760 A | 4/1998 | Picazo, Jr. et al. | 395/200.02 |
| 5,764,584 A | 6/1998 | Fukiage et al. | 365/230.03 |
| 5,778,419 A | 7/1998 | Hansen et al. | 711/112 |
| 5,793,688 A | 8/1998 | McLaury | 365/203 |
| 5,793,996 A | 8/1998 | Childers et al. | 710/129 |
| 5,812,074 A | 9/1998 | Chung | 341/67 |
| 5,813,023 A | 9/1998 | McLaury | 711/105 |
| 5,825,711 A | 10/1998 | Manning | 365/230.03 |
| 5,831,929 A | 11/1998 | Manning | 365/233 |
| 5,835,925 A | 11/1998 | Kessler et al. | 711/2 |
| 5,838,990 A | 11/1998 | Park et al. | 395/834 |
| 5,848,431 A | 12/1998 | Pawlowski | 711/5 |
| 5,860,080 A | 1/1999 | James et al. | 711/4 |
| 5,887,146 A | 3/1999 | Baxter et al. | 395/284 |
| 5,907,860 A | 5/1999 | Garibay, Jr. et al. | 711/117 |
| 5,920,510 A | 7/1999 | Yukutake et al. | 365/189.05 |
| 5,920,710 A | 7/1999 | Tan et al. | 395/392 |
| 5,946,260 A | 8/1999 | Manning | 365/230.03 |
| 5,954,804 A | 9/1999 | Farmwald et al. | 710/36 |
| 5,996,043 A | 11/1999 | Manning | 711/105 |
| 6,032,220 A | 2/2000 | Martin et al. | 711/5 |
| 6,032,232 A | 2/2000 | Lindeborg et al. | 711/149 |
| 6,035,369 A | 3/2000 | Ware et al. | 711/105 |
| 6,055,615 A | 4/2000 | Okajima | 711/169 |
| 6,175,905 B1 | 1/2001 | Manning | 711/169 |
| 6,178,488 B1 | 1/2001 | Manning | 711/169 |

| CA9 | CA8 | CA7 | CA6 | CA5 | CA4 | CA3 | CA2 | CA1 | CA0 |
|---|---|---|---|---|---|---|---|---|---|
| ID6 | ID5 | ID4 | ID3 | ID2 | ID1 | ID0 | CMD5 | CMD4 | CMD3 |
| CMD2 | CMD1 | CMD0 | BNK2 | BNK1 | BNK0 | ROW9 | ROW8 | ROW7 | ROW6 |
| ROW5 | ROW4 | ROW3 | ROW2 | ROW1 | ROW0 | 0 | 0 | 0 | 0 |
| 0 | 0 | 0 | COL6 | COL5 | COL4 | COL3 | COL2 | COL1 | COL0 |

ID6–ID0 = DEVICE ID VALUE
CMD5–CMD0 = COMMAND CODE
BNK2–BNK0 = BANK ADDRESS
ROW9–ROW0 = ROW ADDRESS
COL6–COL0 = COLUMN ADDRESS
0 = UNUSED

Fig. 2

METHOD AND SYSTEM FOR BYPASSING PIPELINES IN A PIPELINED MEMORY COMMAND GENERATOR

CROSS-REFERENCE TO RELATED APPLICATIONS

This application is a continuation of U.S. patent application Ser. No. 09/126,318, filed Jul. 30, 1998 now U.S. Pat. No. 6,175,905.

TECHNICAL FIELD

This invention relates to memory devices used in computer systems, and, more particularly, to a method and system for by passing the pipelines of a pipelined memory command generator during low latency memory operations.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 300 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a substantially lower frequency. Currently, for example, a processor having a 300 MHz clock frequency may be mounted on a motherboard having a 66 MHz clock frequency for controlling the system memory devices and other components.

Access to system memory is a frequent operation for the processor. The time required for the processor, operating, for example, at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor either directly through the processor bus or through a memory controller. As a result, SyncLink DRAM memory devices are able to operate at a speed that is substantially faster than conventional DRAM memory devices. Rather than requiring that separate address and control signals be provided to the system memory, SyncLink memory devices receive command packets that include both control and address information. The SyncLink memory device then outputs or receives data on a data bus that may be coupled directly to the data bus portion of the processor bus.

An example of a computer system 10 using the SyncLink architecture is shown in FIG. 1. The computer system 10 includes a processor 12 having a processor bus 14 coupled to three packetized dynamic random access memory or SyncLink DRAM ("SLDRAM") devices 16a–c. The computer system 10 also includes one or more input devices 20, such as a keypad or a mouse, coupled to the processor 12 through a bus bridge 22 via an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c on the bus bridge 22 having a unique identifier, and the command packet containing an identifying code that selects only one of these components.

A typical command packet for a SyncLink packetized DRAM is shown in FIG. 2. The command packet is formed by 4 packet words each of which contains 10 bits of data. The first packet word $W_1$ contains 7 bits of data identifying the packetized DRAM 16a–c that is the intended recipient of the command packet. As explained below, each of the packetized DRAMs is provided with a unique ID code that is compared to the 7 ID bits in the first packet word $W_1$. Thus, although all of the packetized DRAMs 16a–c will receive the command packet, only the packetized DRAM 16a–c having an ID code that matches the 7 ID bits of the first packet word $W_1$ will respond to the command packet.

The remaining 3 bits of the first packet word $W_1$ as well as 3 bits of the second packet word $W_2$ comprise a 6 bit command. Typical commands are read and write in a variety of modes, such as accesses to pages or banks of memory cells. The remaining 7 bits of the second packet word $W_2$ and portions of the third and fourth packet words $W_3$ and $W_4$ comprise a 20 bit address specifying a bank, row and column address for a memory transfer or the start of a multiple bit memory transfer. In one embodiment, the 20-bit address is divided into 3 bits of bank address, 10 bits of row address, and 7 bits of column address.

Although the command packet shown in FIG. 2 is composed of 4 packet words each containing up to 10 bits, it will be understood that a command packet may contain a lesser or greater number of packet words, and each packet word may contain a lesser or greater number of bits.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

One of the memory devices 16a is shown in block diagram form in FIG. 3. The memory device 16a includes a clock divider and delay circuit 40 that receives a command clock signal 42 and generates a large number of other clock and timing signals to control the timing of various operations in the memory device 16. The memory device 16a also includes a command buffer 46 and an address capture circuit 48, which receive an internal clock CLK signal, a command packet CA0–CA9 on a command bus 50, and a FLAG signal on line 52. As explained above, the command packet contains control and address information for each memory transfer, and the FLAG signal identifies the start of a command packet. The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command packet is directed to the memory device 16a, it then provides the command packet to a command decoder and sequencer 60.

The command decoder and sequencer 60 generates a large number of internal control signals to control the operation of the memory device 16a during a memory transfer corresponding to the memory command packet. More specifically, the command decoder and sequencer 60 operates in a pipelined fashion by storing memory commands corresponding to respective command packets as the command packets are received. In fact, the command decoder and sequencer 60 may receive and store memory commands at a rate that is faster than the rate that the memory commands can be processed. The command decoder and sequencer 60 subsequently issues command signals corresponding to the respective memory commands at respective times that are determined by a latency command. The latency command specifies the number of clock pulses or clock edges that will occur between than the start and the resultant clocking of data into or out of the memory device 16a. The latency command may be programmed into the memory device 16a by conventional means, such as by programming an anti-use. However, the latency command may also be part of an initialization packet that is received by the memory device 16a upon initialization.

The address capture circuit 48 also receives the command packet from the command bus 50 and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70.

One of the problems of conventional DRAMs is their relatively low speed resulting from the time required to precharge and equilibrate circuitry in the DRAM array. The packetized memory device 16a shown in FIG. 3 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of the bank address from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and I/O gating circuit 102 to a data path subsystem 108, which includes a read data path 110 and a write data path 112. The read data path 110 includes a read latch 120 receiving and storing data from the I/O gating circuit 102. In the memory device 16a shown in FIG. 3, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126. The FIFO buffer 124 sequentially applies the 16-bit words and two clock signals (a clock signal and a quadrature clock signal) to a driver circuit 128 which, in turn, applies the 16-bit data words to a data bus 130 forming part of the processor bus 14. The driver circuit 128 also applies the clock signals to a clock bus 132 so that a device, such as the processor 12 reading the data on the data bus 130, can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifier 104.

As mentioned above, an important goal of the SyncLink architecture is to allow data transfer between a processor and a memory device to occur at a significantly faster rate. However, the operating rate of a packetized DRAM, including the packetized memory device 16a shown in FIG. 3, is limited by the time required to receive and process command packets applied to the memory device 16a. More specifically, not only must the command packets be received and stored, but they must also be decoded and used to generate a wide variety of signals. However, in order for the memory device 16a to operate at a very high speed, the command packets must be applied to the memory device 16a at a correspondingly high speed. As the operating speed of the memory device 16a increases, the command packets are provided to the memory device 16a at a rate that can exceed the rate at which the command buffer 46 can process the command packets. Furthermore, as the operating speed of the packetized memory device 16a increases, the required latency of command signals issued by the command decoder and sequencer 60 may become shorter than the minimum latency that the command decoder and sequencer 60 is capable of operating. In other words, it may become necessary for the command decoder and sequencer 60 to issue command signals sooner than the command decoder and sequencer 60 is capable of issuing such command signals, partly because of the pipelined nature of the operation of the command decoder and sequencer 60.

Although the foregoing discussion is directed to the need for faster command buffers in packetized DRAMs, similar problems exist in other memory devices, such as asynchronous DRAMs and synchronous DRAMs, which must process control and other signals at a high rate of speed.

SUMMARY OF THE INVENTION

A memory device command generator includes a command pipeline adapted to receive and store a plurality of memory commands, and then output corresponding command signals. The command pipeline outputs each command signal at times relative to receipt of the memory command that is determined by a latency command. However, for the command pipeline to output the command signal at the time specified by the latency command, the latency command must specify a latency that is greater than a minimum latency of the command pipeline. If the latency command specifies a latency that is less than the minimum latency of the command pipeline, a bypass circuit rather than the command pipeline generates the command signal, and it does so at a time that is less than the minimum latency of the command pipeline as specified by the latency command. In such case, the bypass circuit inhibits the command pipeline from generating the command signal so that only one command signal is generated responsive to the memory command. The bypass circuit may include a latch circuit that outputs the command signal. The latch preferably is reset to terminate the command signal by an acknowledgment signal that is generated by circuitry receiving the command signal. The inventive method and system for bypassing pipelines in a pipelined command generator may be used in a wide variety of memory devices. However, it is particularly well adapted for use in a packetized dynamic random access memory device in which the memory commands are in the form of command packets of command data indicative of a memory operation, a row address and a column address.

BRIEF DESCRIPTION OF THE DRAWINGS

FIG. 2 is a diagram showing a typical command packet for a SyncLink packetized dynamic random access memory device.

DETAILED DESCRIPTION OF THE INVENTION

Figure 1:
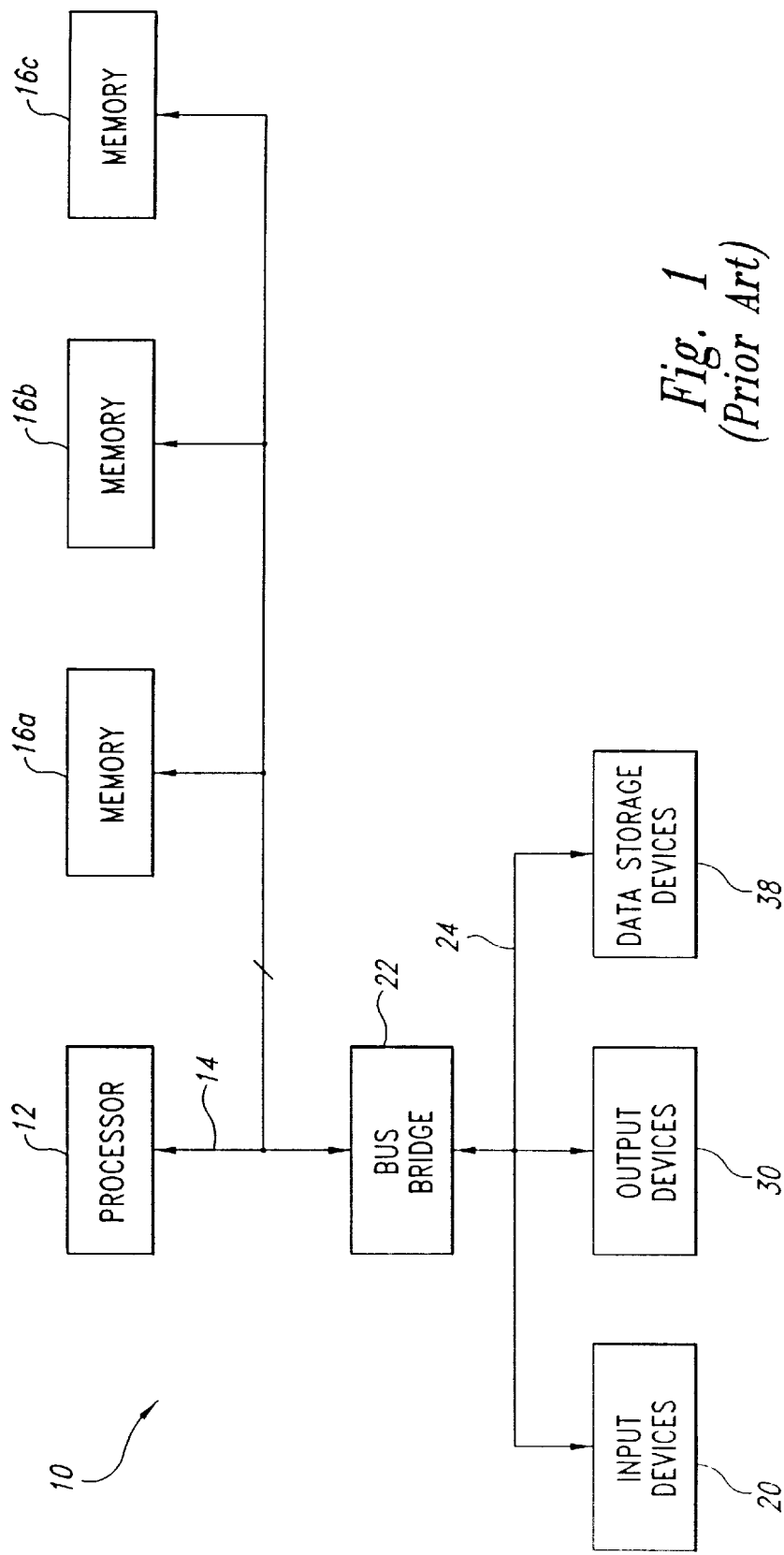
FIG. 1 is a block diagram of a computer system containing several SyncLink packetized dynamic random access memory devices.
Figure 3:
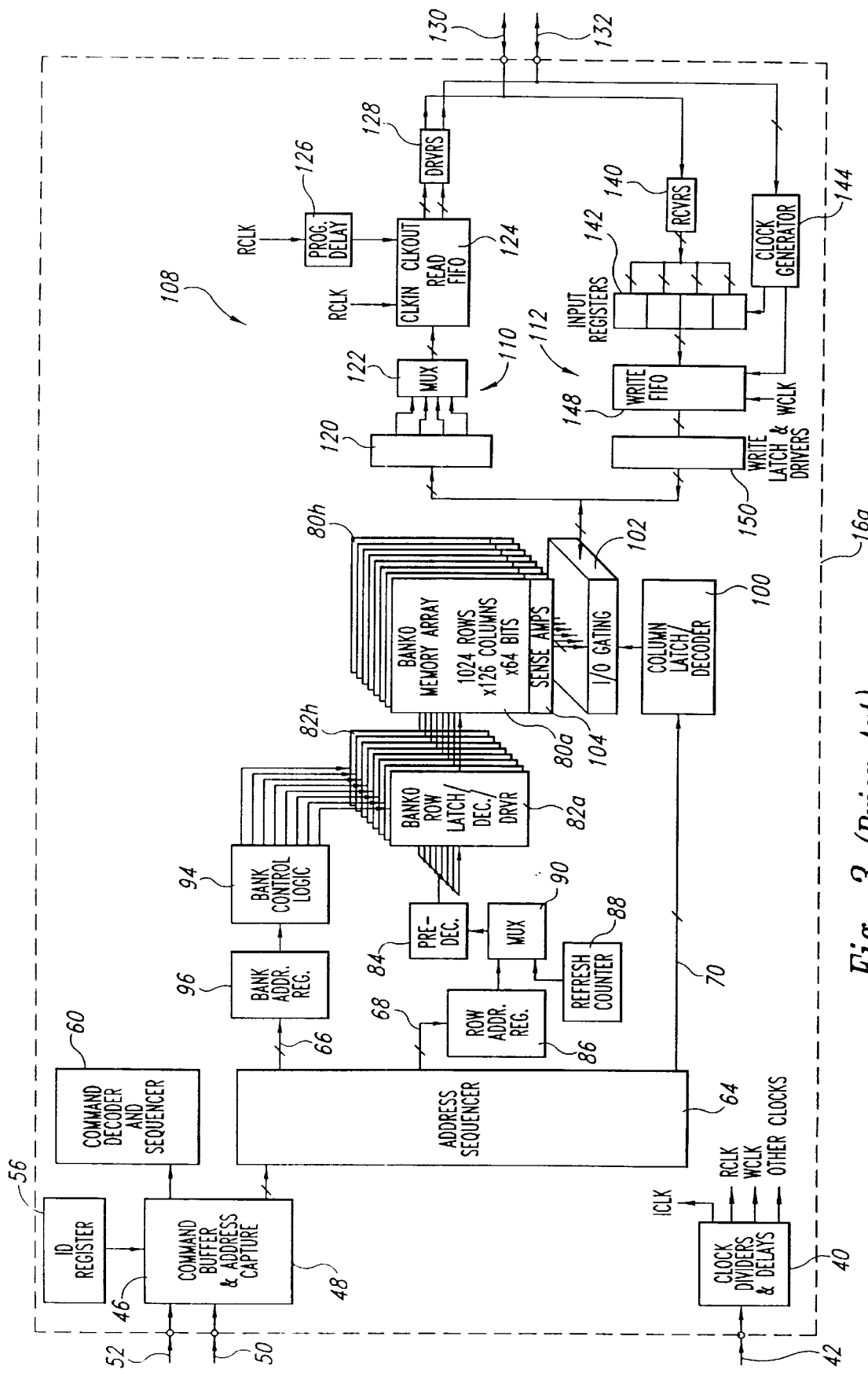
FIG. 3 is a block diagram of a SyncLink packetized dynamic random access memory device that may be used in the computer system of FIG. 1.
Figure 4:
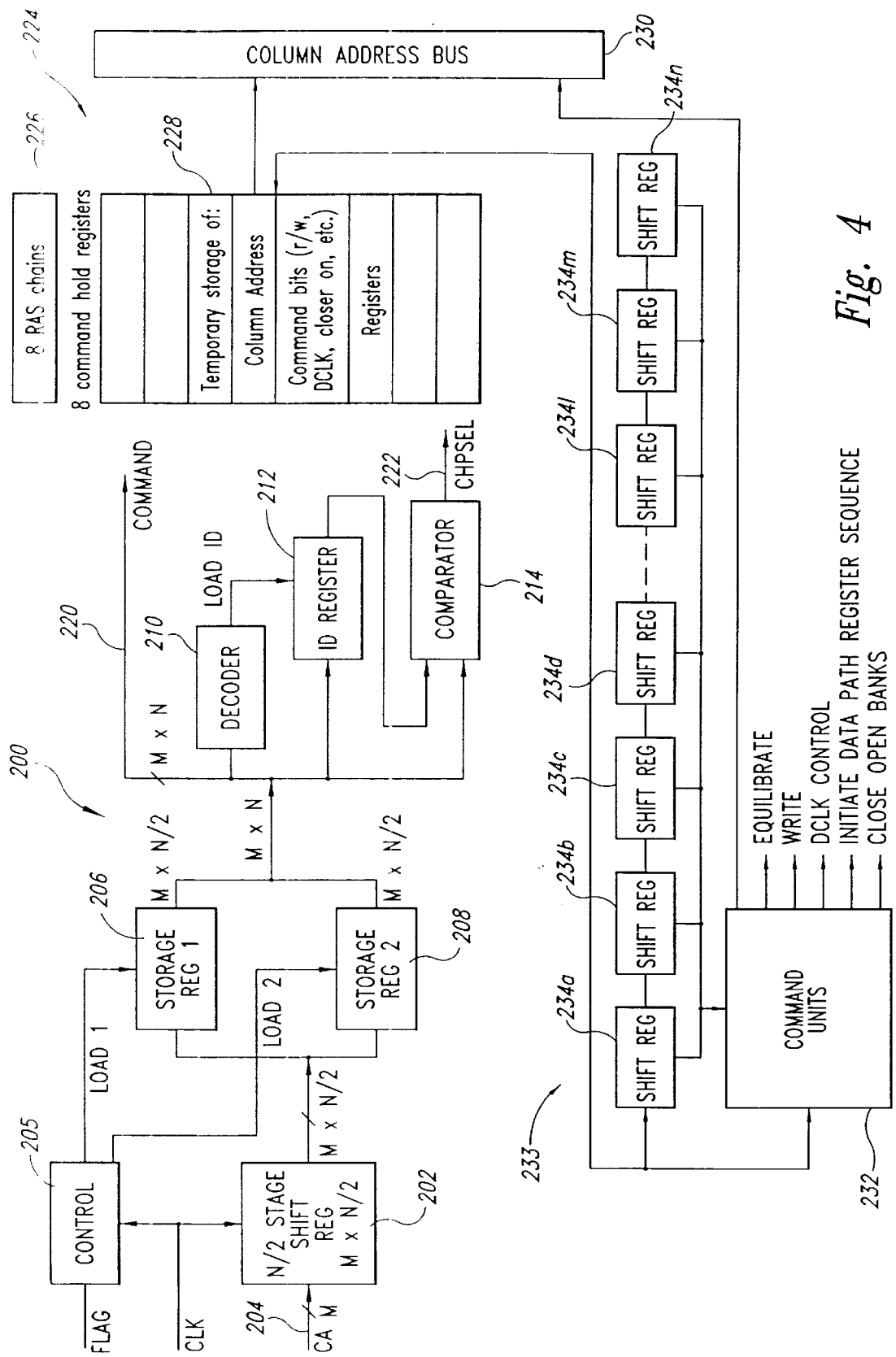
FIG. 4 is a block diagram of an embodiment of a command buffer and a pipelined command decoder and sequencer that is usable in the SyncLink packetized dynamic random access memory device of FIG. 3.

One embodiment of a command buffer 200 that may be used in place of the command buffer 46 of FIG. 3 is shown in FIG. 4. The command buffer 200 shown in FIG. 4 is described in U.S. Pat. No. 6,202,119 issued Mar. 13, 2001 to Troy A. Manning, which is incorporated herein by reference. A memory device 16 of the type shown in FIG. 3 using the command buffer 200 may be used in the computer system shown in FIG. 1.

With reference to FIG. 4, a command packet CA consisting of a plurality of packet words are applied to a shift register 202 via a command bus 204. The width M of the bus 204 corresponds to the size of the shift register 202, and the number N of packet words in the command packet corresponds to an integer sub-multiple of the number of stages of the shift register 202. In the embodiment shown in FIG. 4, the shift register 202 has one-half the number of stages that are in the command packet, i.e., two shift stages since there are four packet words. Thus, the shift register 202 sequentially receives two groups of two 10-bit packet words responsive to a clock signal CLK. Coincident with the start of a four word command packet, a FLAG signal is applied to a control circuit 205 that is clocked by the CLK signal along with the shift register 202.

After two packet words have been shifted into the shift register 202, the control circuit 205 generates a LOAD1 signal that is applied to a first storage register 206. The first two packet words from the shift register 202 are then loaded into the first storage register 206. After two more packet words have been shifted into the shift register 202, the control circuit 205 generates a LOAD2 signal that is applied to a second storage register 208. The second storage register 208 then stores the remaining two packet words from the shift register 202. The first and second storage registers 206, 208 then collectively output a 40-bit command word COMMAND on a command bus 220.

The COMMAND on the command bus 220 is applied to the address decoder and sequencer 60, which includes a command unit 224 including a row command unit ("RCU") 226 and a column command unit ("CCU") 228. The RCU 226 is responsible for handling row addresses and row commands while the CCU 228 is responsible for handling column and bank addresses as well as commands relating to the columns of the memory arrays 80 (FIG. 3).

The CCU 228 outputs column and bank addresses to a column address bus 230, high level commands to a command execution unit 232, and timing signals to a sequencer 233 formed by a series of shift registers 234a–n. The shift registers 234 control the timing of column commands, such as EQUILIBRATE, WRITE, DCLK (data clock) CONTROL, etc., issued by the command execution unit 232 responsive to command signals from the CCU 228.

The RCU 226 may be of a somewhat conventional design, and thus will not be described in detail. The CCU 228, command execution unit 232, and sequencer 233 will be described further with reference to FIGS. 5–8.

Figure 5:
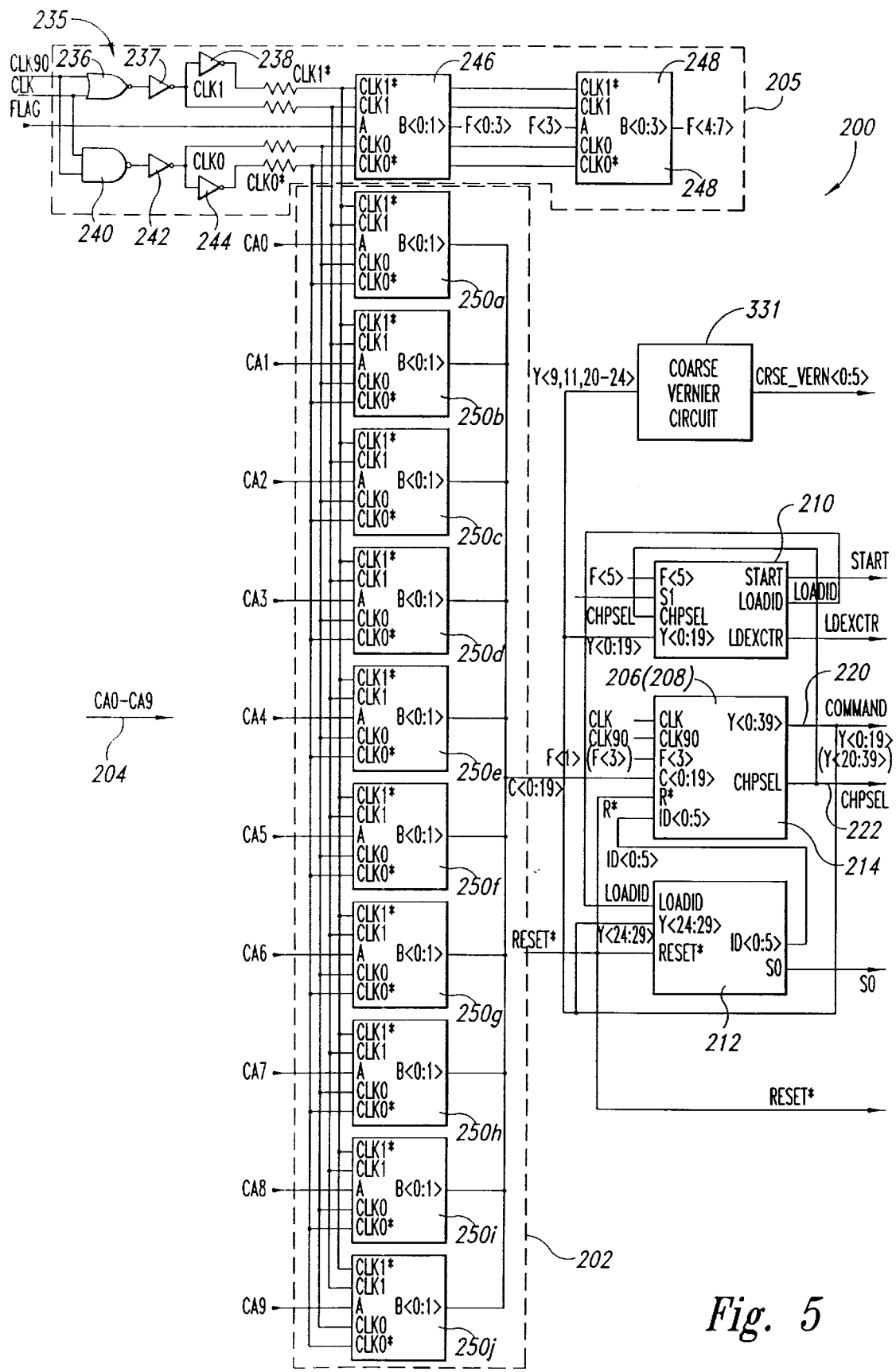
FIG. 5 is a block diagram showing the command buffer of FIG. 4 in greater detail.

With reference to FIG. 5, the control circuit 205 includes a clock circuit 235 that receives the clock signal CLK and its quadrature CLK90 from elsewhere in the memory device that contains the command buffer 200. The CLK and CLK90 signals are applied to a NOR gate 236 which outputs a high whenever CLK and CLK90 are both low, as illustrated in the timing diagram of FIG. 6. The output of the NOR gate 236 is applied through a first inverter 237 to generate a CLK1 signal and then through a second inverter 238 to generate a CLK1* signal (the "*" symbol after a signal name is used throughout to designate the compliment of the signal).

Figure 6:
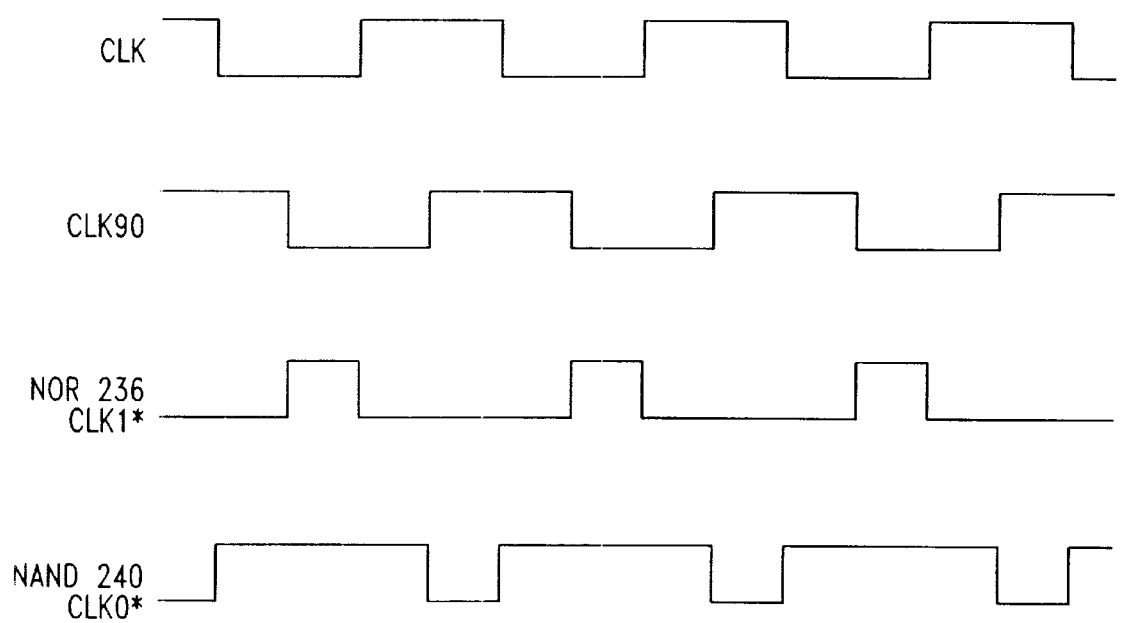
FIG. 6 is a timing diagram showing the clock signals used in a portion of the command buffer shown in FIG. 5.

The CLK90 and CLK signals are also applied to a NAND gate 240 that outputs a low whenever both CLK and CLK90 are high, as also illustrated in FIG. 6. The output of the NAND gate 240 is coupled through an inverter 242 to generate a CLK0 signal and then through a second inverter 244 to generate a CLK0* signal. These signals are used throughout the command buffer 200, as explained in detail below.

The control circuit 205 also includes a pair of shift registers 246, 248 that are connected in series with each other to form an 8-stage shift register. The shift register 246 receives the FLAG signal and sequentially shifts it through the four stages of the shift register circuit 246 and then through the four stages of the shift register circuit 248 responsive to the CLK0, CLK0*, CLK1, and CLK1* signals. The FLAG signal is shifted through two stages of the shift register circuits 246, 248 each cycle of the CLK signals. Thus, when FLAG goes high, two successive F<7:0> outputs of the shift register circuits 246, 248 sequentially go high each clock cycle.

The shift register 202 shown in FIG. 5 includes ten separate shift register circuits 250a–j, each of which receive a respective bit CA0–CA9 of the incoming 10-bit packet word. Each of the shift register circuits 250a–j includes two shift register stages. Thus, after each clock cycle, two command bits CA have been shifted into each shift register circuit 250, and these bits are available as a 2-bit word B<1:0>. Thus, the ten shift register circuits 250a–j collectively output a 20-bit word C<19:0> corresponding to the first 20 bits of the command packet. These 20 bits are then stored in the storage register 206. After two more packet words have been shifted into the shift register circuits 250a–j, a second 20-bit word C<19:0> corresponding to the second 20 bits of the command packet is output from the shift register circuits 250a–j. These 20 bits are then stored in the storage register 208. The storage registers 206, 208 shown in FIG. 5 store all of the packet words from each command packet after all four of the packet words have been shifted into the shift register 202. The storage registers 206, 208 then output a 40-bit command word Y<39:0>. However, it will be understood that packet words shifted into a shift register may be transferred to one or more storage registers before all of the packet words of a command packet have been shifted into the shift register.

The command buffer 200 also includes a coarse vernier circuit 331. As explained below, the coarse vernier circuit 331 generates a 6-bit coarse vernier word CRSE_VERN<5:0> from a portion of the command word Y<20:24, 11, 9>. As further explained below, the coarse vernier word CRSE_VERN<5:0> is used to preload counters (not shown) in the column command unit 228.

Figure 7:
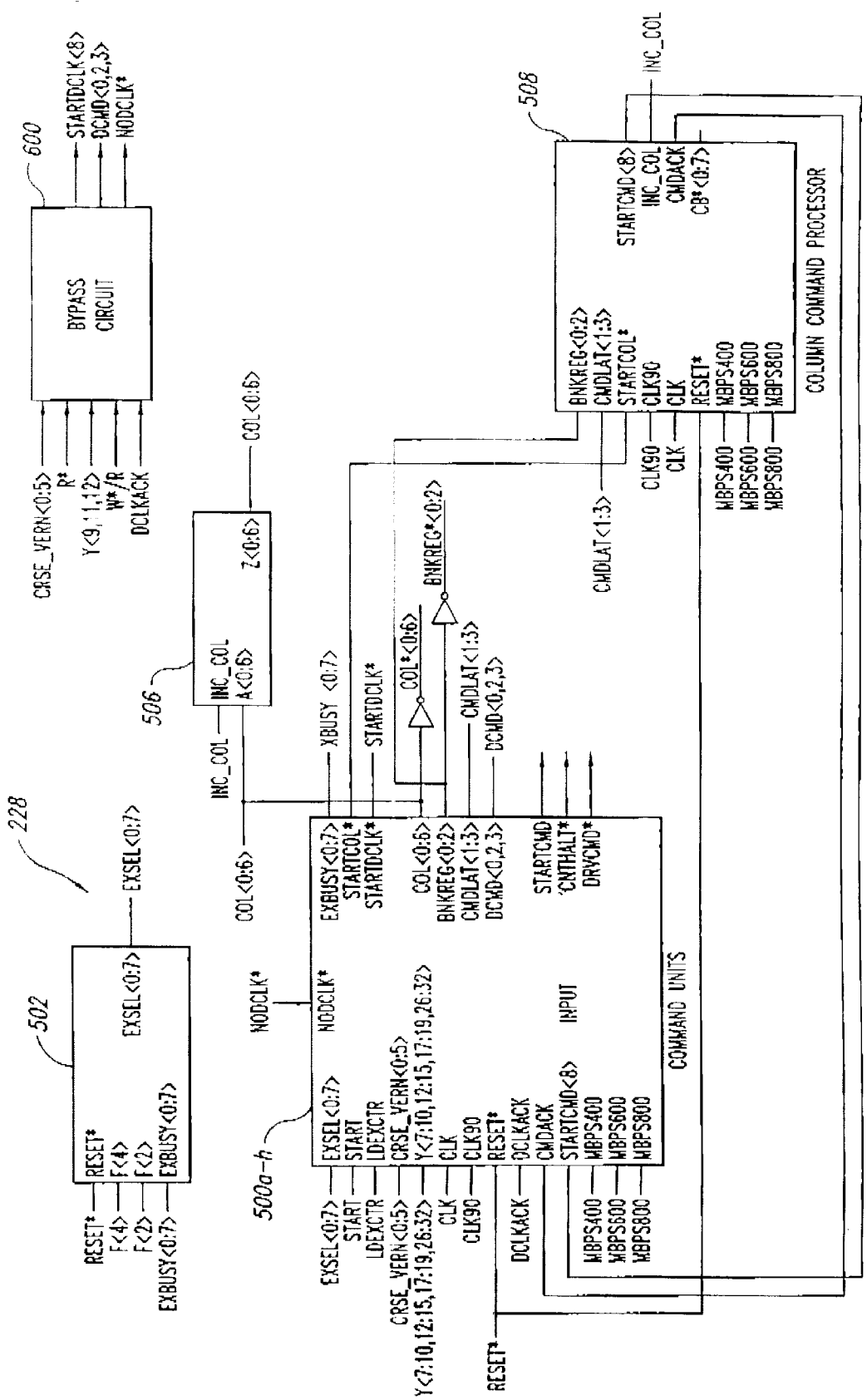
FIG. 7 is a block diagram of a pipelined address decoder and sequencer including a pipeline bypass system according to one embodiment of the invention that may be used in the SyncLink packetized dynamic random access memory device of FIG. 3.
Figure 8A:
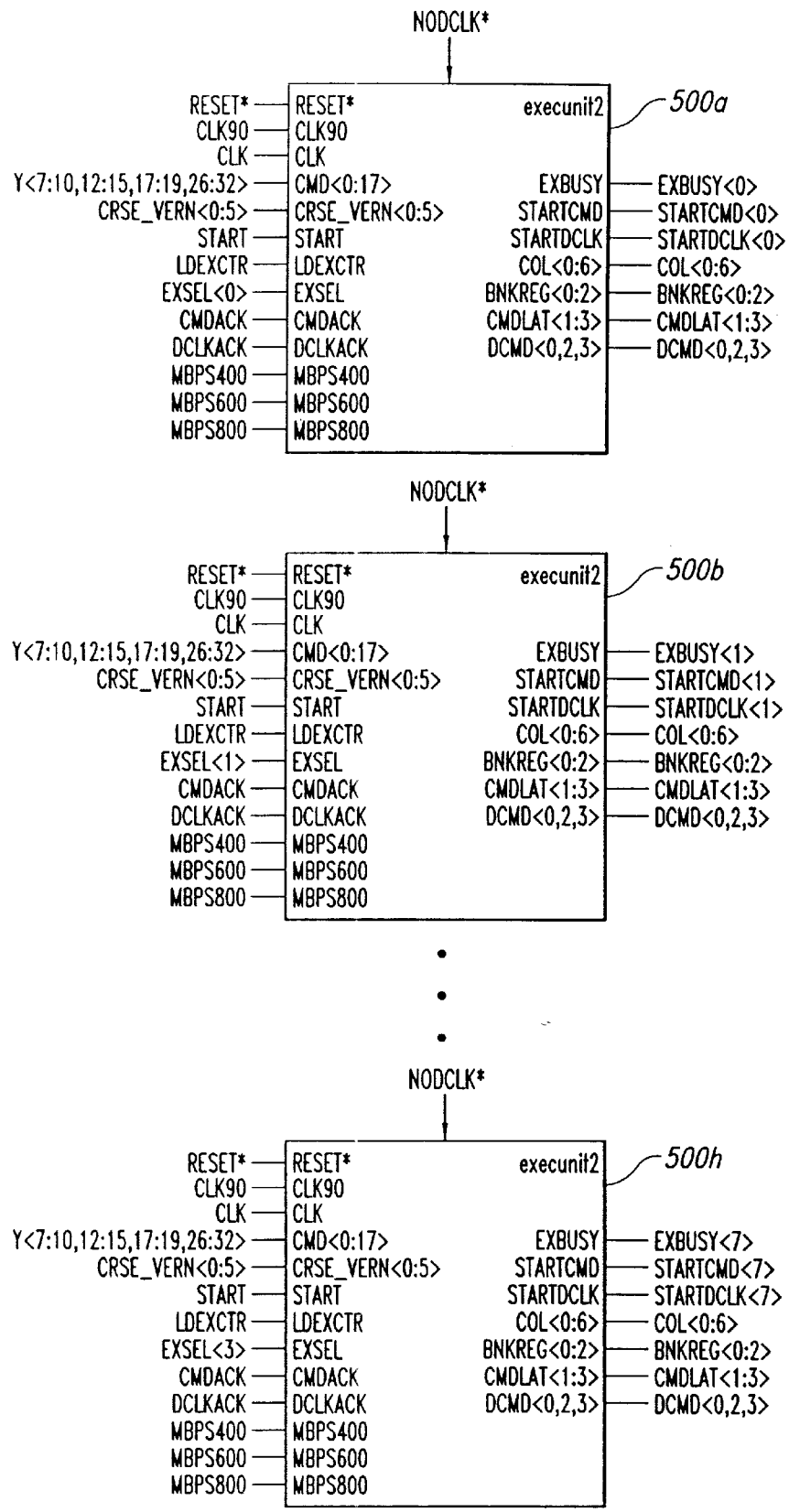
FIGS. 8A and 8B are block diagrams of command units and other circuitry used in the address decoder and sequencer of FIG. 7.
Figure 8B:
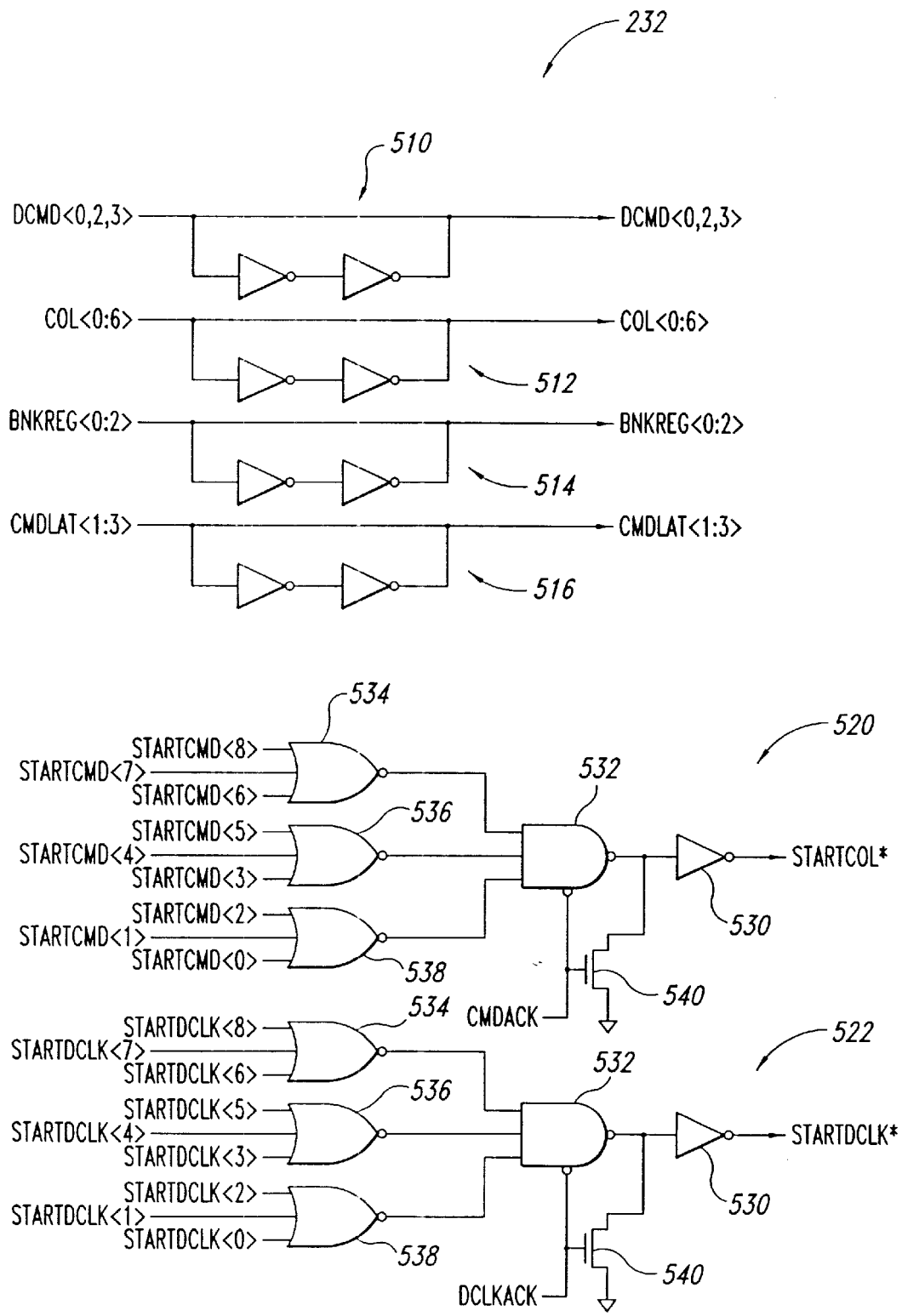

As mentioned above with reference to FIG. 4, the address decoder and sequencer 60 includes a column command unit 228, which is illustrated in greater detail in FIGS. 7 and 8. With reference to FIG. 7, the column command unit 228 includes eight command units 500 (shown as a single block in FIG. 7), and corresponding command unit selectors 502 (also shown as a single block in FIG. 7). The command units 500 receive bits Y<32:26, 19:17, 15:12, 10:7> of the command word stored in the storage registers 206, 208 (FIG. 4). The command units also receive the coarse vernier signals CRSE_VERN<5:0> from the coarse vernier circuit 331 (FIG. 5), MBPS400–800 signals indicative of the clock speed from elsewhere in the command decoder 200, the clock signals CLK and CLK90, a data clock acknowledge signal DCLKACK, and eight select signals EXSEL<7:0>. As explained below, the EXSEL<7:0> signals enable respective ones of the eight command units 500. The command units 500 generate a seven bit column address COL<6:0> that is applied to a column address processing unit 506. The column address processing unit 506 outputs a column address COL<6:0> that corresponds to an initial column address which may be incremented responsive to an INC_COL signal. Finally, the command units 500 output busy signals EXBUSY<7:0> indicating that a respective one of the command units 500 is busy, and various control signals STARTCOL*, STARTDCLK*, BNKREG<2:0>, CMDLAT<3:1>, DCMD<3,2,0>, STARTCMD<7:0>, CNTHALT*, and DRVCMD* which are used in a manner described below. Each of the command units 500 also receives a NODCLK* signal. The NODCLK* signal is gated (not shown) with the signals generating the STARTDCLK signal to prevent the command units 500 from generating respective STARTDCLK signals when NODCLK* is active low. As explained below, an active low NODCLK* signal is generated when the command units 500 are to be bypassed and the STARTDCLK signal is this generated by other circuitry described below.

The command unit selector 502 controls the storing of command words in each of the command units 500a–h in a manner that prevents a single command word from being stored in more than one command unit 500. The command unit selector 502 also prevents a command word from overwriting a command word previously stored in a command unit 500 before the command unit has generated corresponding command signals from the stored command word. Basically, each command unit 500 generates a respective active high EXBUSY<7:0> signal when a command word has been stored in the command unit 500a–h. After command signals have been generated from the stored command word, the EXBUSY<7:0> signals transitions inactive low so that command words may once again be stored in the command unit 500a–h.

The command unit selector 502 controls which of the command units 500a–h store a command word output from the storage registers 206, 208 by issuing an active high EXSEL<7:0> signal to one and only one of the command units 500a–h at a time. The command unit 500a–h receiving the EXSEL<7:0> signal then stores the command word. The command unit selector 502 determines which command unit 500a–h should receive the EXSEL<7:0> signal by examining the EXBUSY<7:0> signals from all of the command units 500a–h. The command unit selector 502 arranges the command units 500a–h in a hierarchy from the first command unit 500a to store a command word (i.e., none of the command units have yet stored a command word) to the last command unit 500h to store a command word (i.e., all of the other command units 500a–g have already stored a command word). The command unit selector 502 issues an active high EXSEL<7:0> signal to a command word only if its EXBUSY<7:0> signal is active low and the respective EXBUSY<7:0> signals for all command units 500 higher in the hierarchy are active high. The selected command unit 500 then receives and processes the command word COMMAND from the storage units 206, 208 as explained in greater detail below.

The column command unit 228 also includes a column command processor 508 that includes the column execution unit 232 and the sequencer 233 of FIG. 4. The column command processor 508 receives the BNKGEG<2:0>, CMDLAT<3:1>, and STARTCOL* signals from the command units 500, as well as the clock signals CLK and CLK90, and clock speed signals MBPS400–800 that are also applied to the command units 500a–h. The column command processor 508 then outputs the INC_COL signal to the column address processing unit 506, and STARTCMD<8>, CMDACK and CB*<7:0> signals to the command units 500a–h.

As mentioned above, the column command unit 228 includes eight identical command units 500a–h that are shown in FIG. 8 along with some additional circuitry that is part of the column command unit 228. Each of the command units 500a–h is capable of storing predetermined portions of the command word Y<39:0> received from the storage registers 206, 208. The stored command words are used to generate a sequence of command signals that cause corresponding functions to be performed in the memory device. The command words may be stored in the command units 500a–h at a faster rate than the memory device 16 is able to perform the corresponding functions. The use of multiple command units 500a–h, each of which stores a respective command word, provides significant advantages to increase the speed of the memory device 16. By using multiple command units 500a–h, the memory device 16 can continue to receive command packets even though the prior command packet has not yet been processed. In fact, the command packets can be received as long as the average rate at which the command packets are received is less than the average time to process the command packets and complete memory transfer operations. As a result, memory devices using the command buffer 200 are able to operate at a relatively high speed.

The command execution unit 232 also includes four latches 510, 512, 514, 516 formed by respective pairs of inverters connected in a loop. The latches 510–516 output respective latched DCMD<3,2,0>, COL<6:0>, BNKREG<0>, and CMDLAT<3:1> signals. The command execution unit 232 also includes a pair of identical logic circuits 520, 522 for generating STARTCOL* and STARTDCLK* signals, respectively. The STARTCOL* signal is generated at the output of an inverter 530 which is, in turn, driven by a NAND gate 532. The NAND gate 532 is driven by three NOR gates 534, 536, 538 each of which receives a respective bit of a STARTCMD<8:0> signal. The NAND gate 532 is enabled by an active low CMDACK signal. When the CMDACK signal is high, a transistor 540 is turned on to force STARTCOL* high. The logic circuit 520 generates an inactive high STARTCOL* signal when all nine bits of STARTCOL<8:0> are inactive low. Thus, if one or more bits of STARTCOL<8:0> is active high, STARTCOL* will be active low. Active high STARTCOL<8:0> bits signify the start of a column command by a respective command unit 500a–h. Thus, an active low STARTCOL* signal indicates the start of a column command by one of the command unit 500a–h.

The logic circuit 522 is structurally and functionally identical to the logic circuit 520, and its operation will therefore not be explained in detail. Briefly, the logic circuit 522 generates an inactive high STARTDCLK* signal when all nine bits of STARTDCLK<8:0> are in active low. Thus, if one or more bits of STARTDCLK<8:0> is active high, STARTDCLK* will be active low. The STARTDCLK* signal can also be forced high by DCLKACK being high. An active high STARTDCLK<8:0> initiates clocking of data to or from one of the memory arrays 80 through one of the data paths 108, 112 responsive to a command signal from a respective command unit 500a–h (FIG. 3). As explained below, there is a latency period required before the data clock can accommodate to a transfer of data responsive to a column command initiated when the STARTCOL* signal goes active low. If the command unit 500 is programmed to initiate a data transfer before the required latency period of the data clock, the data clock will be unable to transfer data when the array is ready to receive the data (in the case of a WRITE operation) or the array is ready to output the data (in the case of a READ operation). As mentioned above and explained further below, the purpose of the inventive pipeline bypass system and method is to generate the STARTDCLK* at an earlier time when the command units 500 are programmed to generate column commands with a shorter latency period. Under these circumstances, the STARTDCLK* signal is generated by a dedicated circuit rather than by one of the command units 500 generating the STARTDCLK* signal as one of the pipelined commands.

Each of the command units 500 includes a counter (not shown) that is preloaded with the CRSE_VERN<5:0> word responsive a LDXCTR signal generated by the decoder 210 (FIG. 5). The counter also receives a START signal which is also generated by the decoder 210. The START signal causes the counter to begin decrementing. The output of the counter is a 6-bit word CNT<5:0>. The CNT<5:0> word is decoded by various circuits in the command units 500 to cause various commands to be issued. The timing of the various commands is therefore a function of the CRSE_VERN<5:0> word preloaded into the counter. The CRSE_VERN<5:0> word thus provides an indication of the timing of the pipelined commands issued by each of the command units 500. More specifically, the command units 500 generate commands, such as CNTHALT*, DRVCMD*, and STARTCMD, at the proper time depending upon the frequency of the clock signals CLK and CLK90 and the value of the CRSE_VERN<5:0> word preloaded into the counter.

With further reference to FIG. 7, the command buffer also includes a pipeline bypass circuit 600. As mentioned above, the pipeline bypass circuit 600 generates a start data clock STARTDCLK<8> signal that causes the NAND gate 532 (FIG. 8) in the logic circuit 522 to generate a STARTDCLK* signal as explained above. Thus, rather than being generated as a pipelined command by the command unit 500, the STARTDCLK<8> signal is generated by the bypass circuit 600. The bypass circuit 600 generates the STARTDCLK<8> signal when it is necessary for data to be clocked out or into the array before the data clock could otherwise be enabled by a STARTDCLK<n> signal generated by the command unit 500 as one of the pipelined commands. As further explained above, this situation occurs when the command units are commanded to generate the pipelined command signals with a latency that is shorter than the minimum latency at which the command units are capable of generating command signals. In particular, for a READ data transfer, the STARTDCLK* signal must be generated six clock periods (i.e., 12 clock transitions or "ticks") before the data clock clocks the read data from the array. If the command unit 500 is programmed to generate column commands that cause the array to output data 11 or fewer clock ticks after the command unit has become active, the command unit 500 cannot possibly generate the STARTDCLK<7:0> signal at the proper time. To generate the STARTDCLK<7:0> at the proper time would require that STARTDCLK<7:0> be generated 1 clock tick before the command unit became active.

In a similar manner, for a WRITE data transfer, the STARTDCLK* signal must be generated 9 clock ticks before the data clock starts clocking data into the memory array. If the command unit 500 is programmed to generate column commands that cause the array to receive data fewer clock ticks after the command unit 500 has become active, the command unit 500 likewise will be unable to generate the STARTDCLK<7:0> signal at the proper time.

Figure 9:
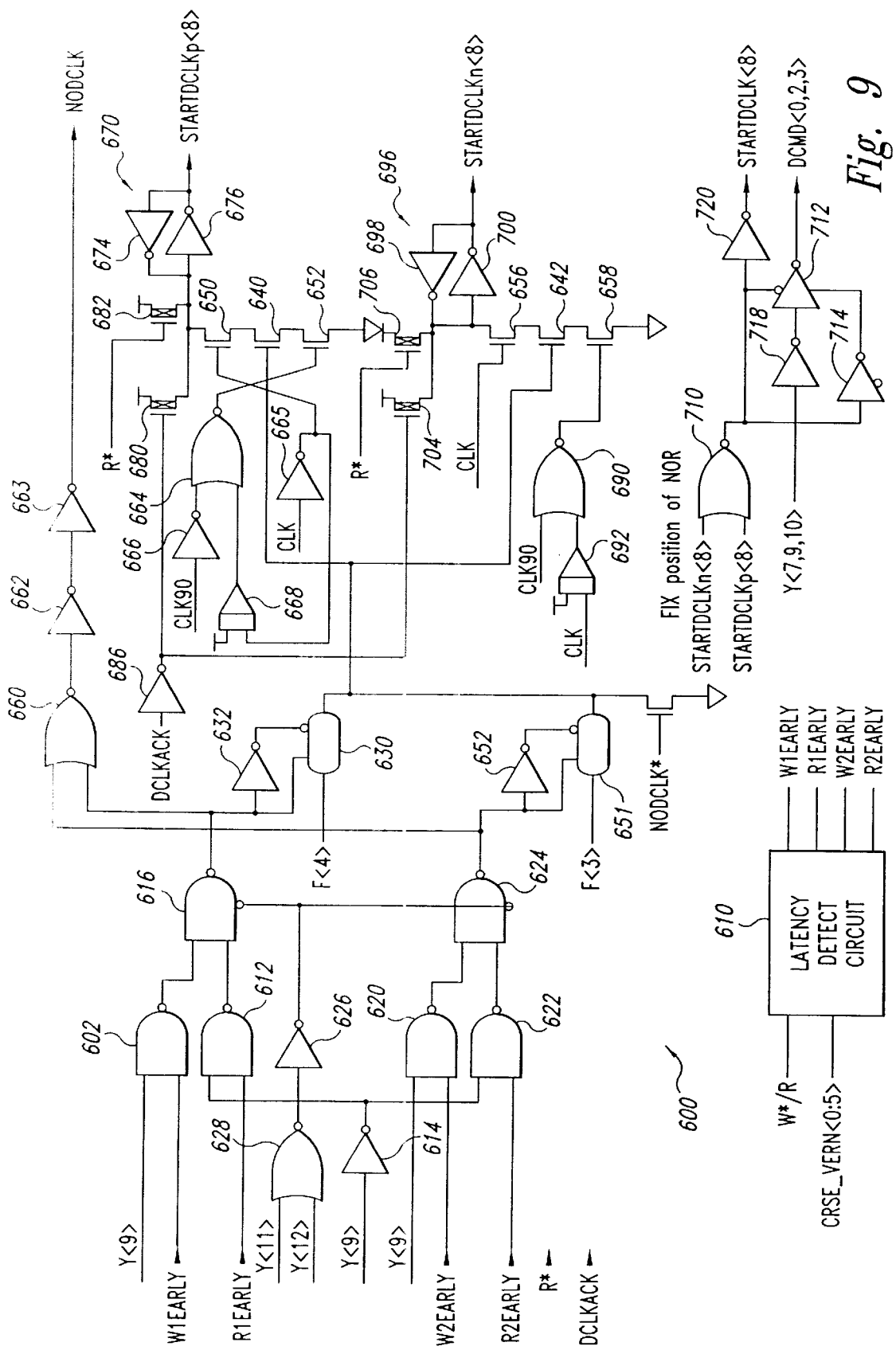
FIG. 9 is a block and logic diagram of a bypass circuit used in the address decoder and sequencer of FIG. 7 to selectively bypass the command units shown in FIGS. 7 and 8A.

One embodiment of the bypass circuit 600 is illustrated in FIG. 9. Basically, the bypass circuit 600 generates the STARTDCLK<8> signal using the F<4> timing signal generated by the control circuit 205 (FIG. 5) when the command unit 500 is programmed to issue commands causing either a READ or a WRITE operation with a latency that is 1 clock tick too early for the command unit 500 to generate the STARTDCLK<8> signal. If the command unit 500 is programmed to issue commands causing either a READ or WRITE operation with a latency that is 2 clock ticks too early, the F<3> timing signal (which occurs 1 clock tick earlier than the F<4> timing signal) is used. However, the STARTDCLK<8> signal will be generated in this manner only if certain other conditions are met, as explained below.

With reference to FIG. 9, a first NAND gate 602 receives a Y<9> bit from the storage register 206 (FIG. 4) and a W1EARLY signal indicative of a WRITE operation with a latency of 10 clock ticks. This signal is generated by a latency detect circuit 610, which is described in detail below. Another NAND gate 612 receives a R1EARLY signal indicative of a READ operation with a latency of 8 clock ticks and the complement of the Y<9> bit generated by an inverter 614. The R1EARLY signal is generated by the latency detect circuit in a manner that will be explained below. The outputs of the NAND gates 602, 612 are applied to a NAND gate 616. When enabled, the NAND gate 616 generates a high when either W1EARLY and Y<9> are both high or when R1EARLY is high and Y<9> is low.

A logic circuit similar to that explained above detects a WRITE operation with a latency of 10 clock ticks or a READ operation having a latency of 7 clock ticks. More specifically, a NAND gate 620 receives a W2EARLY signal indicative of a WRITE operation with a latency of 10 and the Y<9> bit. The W2EARLY signal, which is received from the latency detect circuit 610, is indicative of a WRITE operation having a latency of 10 clock ticks (i.e., 2 clock ticks earlier than the command unit 500 is capable of generating the STARTDCLK<8> signal). Another NAND gate 622 receives a R2EARLY signal, also generated by the latency detect circuit 610, indicative of a READ operation with a latency of 7 clock ticks. The NAND gate 622 also receives complement of the Y<9> bit from the inverter 614. The outputs of the NAND gates 620, 622 are applied to a NAND gate 624. The NAND gate 624 outputs a high whenever either W2EARLY and Y<9> are both high or whenever R2EARLY is high and Y<9> is low.

The NAND gates 616, 624 are enabled by a low at the output of an inverter 626 which, in turn, receives the output of a NOR gate 628. The NOR gate 628 decodes both Y<11> and Y<12> low. Thus, the outputs of the NAND gates 616 can be high, as explained above, only if Y<11> and Y<12> are both low.

The outputs of the NAND gates 616, 624 are used as selector circuits to select either the F<4> timing signal or the F<3> timing signal, respectively, to generate the STARTDCLK<8> signal. The output of the NAND gate 616 is applied to a pass gate 630 directly and through an inverter 632. If the output of the NAND gate 616 is high, the pass gate 630 is enabled, thereby coupling the F<4> timing signal to the gate of respective NMOS transistors 640, 642. Similarly, the output of the NAND gate 624 is applied to a pass gate 651 directly and through an inverter 652. If the output of the NAND gate 624 is high, the pass gate 651 is enabled, thereby coupling the F<3> timing signal to the gates of the NMOS transistors 640, 642, respectively.

The outputs of the NAND gates 616, 624 are also applied to a NOR gate 660. The NOR gate 660 generates an active low NODCLK* signal through 2 inverters 662, 663. The NODCLK* signal is applied to the command units 500 to inhibit the command units 500 from generating a STARTDCLK* signal thereby preventing one of the command units 500 and the bypass circuit 600 from both generating the STARTDCLK* signal.

Figure 10A:
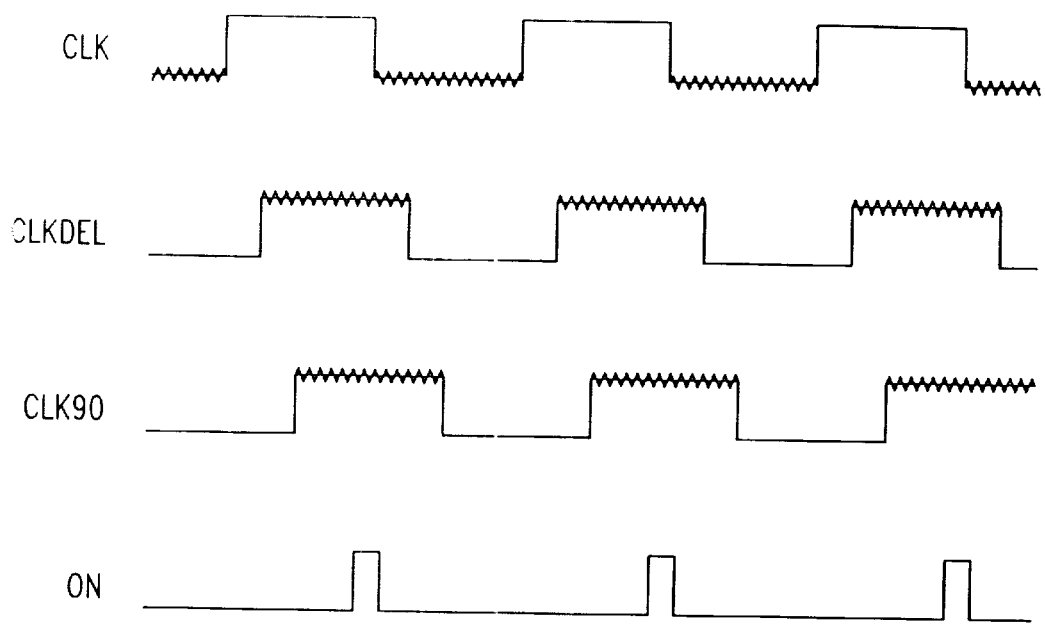
FIGS. 10A and 10B are timing diagrams showing various waveforms present in the bypass circuit of FIG. 9.

As mentioned above, the outputs of the pass gates 630, 650 are applied to the gates of respective NMOS transistors 640, 642. The transistor 640 is connected in series with a pair of NMOS transistors 650, 652. Similarly, the NMOS transistor 642 is connected in series with a pair of NMOS transistors 656, 658. The transistors 650, 652 turn ON for a short period after the trailing edge of a clock CLK signal. More specifically, with reference to FIG. 10A, the gate of the transistor 650 receives the complement of the CLK signal from an inverter 665 and thus turns ON when CLK is low, as indicated by the highlighted portion of the CLK signal shown in FIG. 10A. The gate of the NMOS transistor 652 is coupled to the output of a NOR gate 664, which turns ON the transistor 652 when both of its inputs are low. This condition occurs when the complement of a quadrature clock signal CLK90 at the output of an inverter 666 is high, as also indicated by the highlighted portion of the CLK90 signal in FIG. 10A. Finally, the other input of the NOR gate 664 receives a delayed complement of the CLK signal from a delay circuit 668. The output of the delay circuit 668 is low when the delayed CLK signal is high, as also indicated by the highlighted portion of FIG. 10A. As indicated by the waveform "ON," the highlighted portions of the above-described waveforms coincide at the start at the trailing edge of the CLK signal and terminate at the trailing edge of the delayed CLK signal. The transistors 650, 652 thus turn ON for a period corresponding to the delay of the delay circuit 668.

In operation, the inputs to the latch 670 are initially biased high by either the reset signal R* going low at initialization of the memory device or by the DCLKACK signal having gone high after a previous memory transfer. The STARTDCLKp<8> signal at the output of the latch 670 is thus initially low, and it will remain low unless all of the transistors 640, 650, 652 turn ON at the same time to pull the input to the latch 670 to ground. The input to the latch 670 will be pulled low just after the trailing edge of the CLK signal if either the F<4> timing signal is coupled through the pass gate 630 or the F<3> timing signal is coupled through the pass gate 651 at that time. The STARTDCLKp<8> signal will therefore go active high at the end of each CLK signal in the event of a WRITE or READ operation with a latency that is one or two clock ticks less than the minimum latency that the command units 500 are capable of generating the command word DCMD<0,2,3>.

As mentioned above and described in detail in the aforementioned Manning patent, the relative timing of the command signals generated by the command units 500 is a function of a latency command. A count is initially loaded into respective counters in the command units 500. The value of the count, which is a 6 bit word CRSE_VERN<5:0>, therefore determines the latency of a WRITE or a READ operation. The latency detect circuit 610 receives and decodes the count value CRSE_VERN<5:0> by conventional logic circuitry to determine the latency of a memory transfer operation. The latency detect circuit 610 also receives a signal W*/R indicative of whether the memory transfer is either a WRITE or a READ operation. By decoding the count value CRSE_VERN<5:0> and the W*/R signal by conventional logic circuitry, the latency detect circuit 610 is able to determine whether the memory transfer is a WRITE or a READ operation with a latency that is either one or two clock ticks less than the minimum latency capabilities of the command units 500. The latency detect circuit 610 then generates the signals W1EARLY, R1EARLY, W2EARLY, and R2EARLY, corresponding to its determination.

Figure 10B:
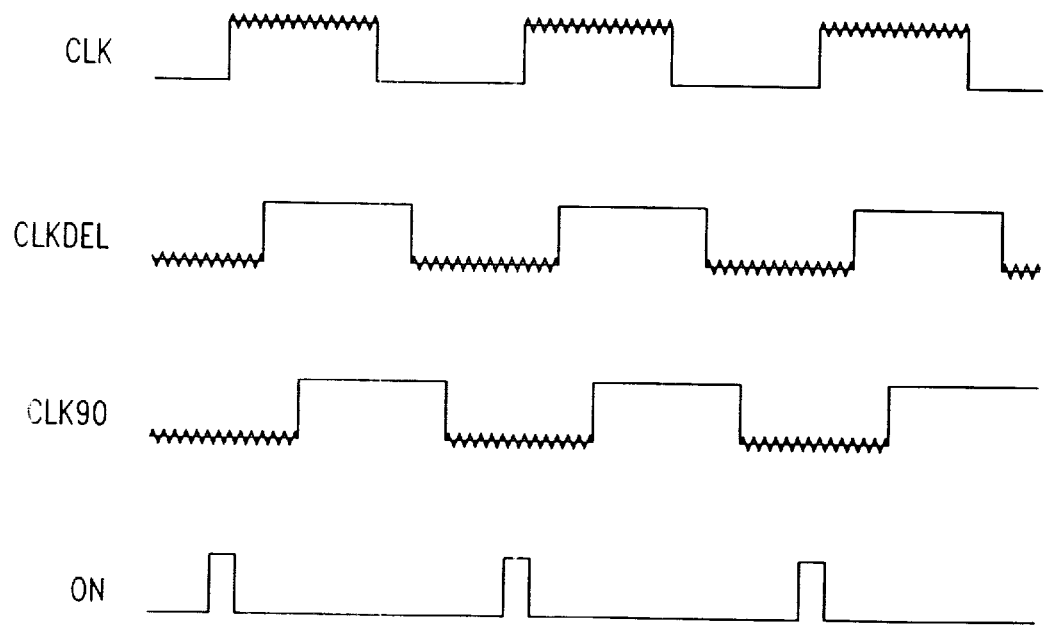

The NMOS transistors 642, 656, 658 operate in substantially the same manner as explained above to generate a STARTDCLKn<8> signal, except that the transistors 656, 658 turn ON for a short period at the leading edge of the CLK signal. As indicated by the highlighted portion of the CLK signal shown in FIG. 10B, the transistor 656 turns ON when the CLK signal is high. The transistor 658 turns ON when the both of the inputs to a NOR gate 690 are low. This condition occurs when the CLK90 signal is low, as also indicated by the highlighted portion of the CLK90 signal shown in FIG. 10B. Finally, the other input to the NOR gate 690 will be low when a delayed clock signal from a delay circuit 692 is low, as indicated by the highlighted portion of the CLKDEL signal shown in FIG. 10B. As shown by the waveform "ON" in FIG. 10B, the highlighted portions of these signals coincide with each other after the leading edge of the CLK signal for duration corresponding to the delay of the delay circuit 692.

The STARTDCLKn<8> signal is generated at the output of a latch 696 formed by pair of inverters 698,700 in the same manner as explained above with respect to the latch 670. Also, the input to the latch 696 is selectively biased high by a pair of PMOS transistors 704, 706, which are turned ON under the same conditions that the PMOS transistors 680, 682 are turned ON. The STARTDCLKn<8> signal is therefore generated at the start of each CLK signal in the event of a WRITE or READ operation with a latency that is one or two clock ticks less than the minimum latency that the command units 500 are capable of generating the command word DCMD<0,2,3>.

The STARTDCLKp<8> and STARTDCLKn<8> signals are applied to a NOR gate 710 that enables three inverters 712 (only one is shown in FIG. 9) whenever its output is low directly and through an inverter 714. Each of the inverters 712 receives a respective complement of one of the Y<7, 9, 10> bits from the storage register 206 (FIG. 4) through respective inverters 718. Thus, the inverters 712, when enabled, generate three command signals that together form the command word DCMD<0,2,3>.

Finally, the output of the NOR gate 710 is coupled through an inverter 720 to generate an active high STARTDCLK<8> signal whenever either STARTDCLKp<8> or STARTDCLKn<8> is active high. The STARTDCLK<8> signal is applied to the NOR gate 534 (FIG. 8B) to generate the STARTDCLK* signal as explained above.

In operation of the command buffer shown in FIGS. 4 and 5 and the address decoder and sequencer 60 shown in FIGS. 4, 7 and 8, the command units 500 normally generate the STARTDCLK* signal to provide the command word DCMD<0,2,3>. However, in the event the command word DCMD<0,2,3> must be provided one or two clock ticks earlier than the command unit 500 is capable of providing the command word DCMD<0,2,3>, DCMD<0,2,3> is provided by the bypass circuit 600. The bypass circuit 600 performs this function by generating the STARTDCLKp<8> and STARTDCLKn<8> signals on either the leading or trailing edge of the CLK signal (whichever occurs first) responsive to either the F<4> timing signal (for a latency of 1 clock tick less than the minimum capability of the command unit 500) or the F<3> timing signal (for a latency of 2 clock ticks less than the minimum capability of the command unit 500). The command word DCMD<0,2,3> remains active until circuitry (not shown in FIG. 7) receiving the data command word DCMD<0,2,3> generates the data clock acknowledge signal DCLKACK. The circuitry receiving the DCMD<0,2,3> word and generating the DCLKACK signal is described in the aforementioned U.S. Pat. No. 6,202,119 issued to Manning, which is incorporated herein by reference. When the DCLKACK signal is received by the bypass circuit 600, it terminates the STARTDCLKp<8> and STARTDCLKn<8> signals, as explained above, which, in turn, terminates the STARTDCLK<8> signal and disables the inverter 712 to terminate the command word DCMD<0, 2,3>.

As mentioned above and described in detail in the aforementioned Manning application, the relative timing of the command signals generated by the command units 500 is a function of a latency command. A count is initially loaded into respective counters in the command units 500. The value of the count, which is a 6 bit word CRSE_VERN<5:0>, therefore determines the latency of a WRITE or a READ operation. The latency detect circuit 610 receives and decodes the count value CRSE_VERN<5:0> by conventional logic circuitry to determine the latency of a memory transfer operation. The latency detect circuit 610 also receives a signal W*/R indicative of whether the memory transfer is either a WRITE or a READ operation. By decoding the count value CRSE_VERN<5:0> and the W*/R signal by conventional logic circuitry, the latency detect circuit 610 is able to determine whether the memory transfer is a WRITE or a READ operation with a latency that is either one or two clock ticks less than the minimum latency capabilities of the command units 500. The latency detect circuit 610 then generates the signals W1EARLY, R1EARLY, W2EARLY, and R2EARLY, corresponding to its determination.

The bypass circuit 600 is thus able to bypass the pipelined command signals issued by the command units 500 whenever a memory operation is called for having a latency that is less than the minimum latency capabilities of the command units 500.

As mentioned above, the command buffer and address decoder and sequencer shown in FIGS. 4–7 may be used in place of the command buffer 48 and the command sequencer and decoder 60 in the packetized memory device 16a that is shown in FIG. 3. The resulting memory device 16a may be used in the computer system shown in FIG. 1 to provide superior operating speed and performance.

While the invention has been described herein by way of exemplary embodiments for purposes of illustration, various modifications may be made without departing from the spirit and scope of the invention. Accordingly, the invention is not limited except as by the appended claims.

What is claimed is:

1. A method of generating a command signal responsive to a memory command applied to a memory device, comprising:

receiving the memory command;

generating the command signal using a bypass circuit at a first time determined by a latency command corresponding to a latency that is shorter than a minimum latency of a command unit; and generating the command signal using the command unit at a second time when the latency is not shorter than the minimum latency of the command unit.

2. The method of claim 1 wherein receiving the memory command comprises receiving a packet of command data indicative of a memory operation, a row address and a column address.

3. The method of claim 1 wherein generating the command signal using a bypass circuit at a first time determined by a latency command corresponding to a latency that is shorter than a minimum latency of a command unit comprises:

providing a plurality of timing signals;

selecting one of the timing signals on the basis of the latency command; and generating the command signal responsive to the selected timing signal.

4. The method of claim 1 herein generating the command signal using a bypass circuit includes generating the command signal until receipt of an acknowledgment signal, the method further comprising:

receiving the command signal generated responsive to a latency command that is shorter than the minimum latency and then processing the received command signal; and in response to receiving the command signal, generating the acknowledgment signal.

5. The method of claim 1 wherein generating the command signal using a bypass circuit comprises generating the command signal that initiates clocking of data to or from a memory array.

6. The method of claim 1 wherein generating the command signal using the command unit comprises generating the command signal that initiates clocking of data to or from a memory array.

7. The method of claims 1, further comprising preventing the bypass circuit and the command unit from both generating the command signal.

8. The method of claim 7 wherein preventing the bypass circuit and the command unit from both generating the command signal comprises generating an inhibiting signal that the command unit and the bypass circuit from both generating the command signal.

9. A method of generating one or more command signals responsive to a plurality of memory commands applied to a memory device, comprising:

storing the plurality of memory commands into a plurality of command units;

determining a plurality of latency periods corresponding to the plurality of memory commands;

in response to at least one of the plurality of latency periods being shorter than a minimum latency of the plurality of command units, generating a first command signal using a bypass circuit; and in response to at least one of the plurality of latency periods not being shorter than the minimum latency of the plurality of command units, generating a second command signal using at least one of the plurality of command units.

10. The method of claim 9 wherein storing the plurality of memory commands into a plurality of command units comprises storing the plurality of memory commands into a plurality of command units at a faster rate than the memory device is able to perform a corresponding plurality of functions.

11. The method of claim 10 herein storing the plurality of memory commands into a plurality of command units comprises storing the plurality of memory commands into a plurality of command units at an average receiving rate that is less than an processing rate that the memory device is able to process the plurality of memory commands and complete corresponding memory transfer operations.

12. The method of claim 9 wherein, in response to at least one of the plurality of latency periods being shorter than a minimum latency of the plurality of command units, generating a first command signal using a bypass circuit comprises:

providing a plurality of timing signals;

selecting one of the timing signals on the basis of the latency command; and generating the command signal responsive to the selected timing signal.

13. The method of claim 9 wherein, in response to at least one of the plurality of latency periods being shorter than a minimum latency of the plurality of command units, generating a first command signal using a bypass circuit includes generating the command signal until receipt of an acknowledgment signal, the method further comprising:

receiving the command signal generated responsive to a latency command that is shorter than the minimum latency and then processing the received command signal; and in response to receiving the command signal, generating the acknowledgment signal.

* * * * *

UNITED STATES PATENT AND TRADEMARK OFFICE
CERTIFICATE OF CORRECTION

PATENT NO. : 6,366,992 B2
DATED : April 2, 2002
INVENTOR(S) : Troy A. Manning

It is certified that error appears in the above-identified patent and that said Letters Patent is hereby corrected as shown below:

<u>Column 15,</u>
Line 51, reads "herein" should read -- wherein --

<u>Column 16,</u>
Line 5, reads "claims" should read -- claim --
Line 35, reads "herein" should read -- wherein --

Signed and Sealed this

Third Day of June, 2003

JAMES E. ROGAN
*Director of the United States Patent and Trademark Office*